United States Patent [19]

Madden

[11] 3,792,412

[45] Feb. 12, 1974

[54] PRINTED WIRING BOARD TERMINAL ASSEMBLY

[75] Inventor: James Joseph Madden, Naperville, Ill.

[73] Assignee: Bell Telephone Laboratories, Incorporated, Murray Hill, N.J.

[22] Filed: July 17, 1972

[21] Appl. No.: 272,317

[52] U.S. Cl. ............ 339/17 C, 317/101, 339/256 R

[51] Int. Cl. ............................................ H05k 1/02

[58] Field of Search ..... 339/17, 18, 95, 176, 65, 66, 339/252, 256, 258, 275, 217 R, 217 S; 317/101 CC, 101 C; 174/68.5

[56] References Cited

UNITED STATES PATENTS

| | | | |
|---|---|---|---|
| 3,252,204 | 5/1966 | McFadden | 339/275 B X |
| 3,281,760 | 10/1966 | Oshima et al. | 339/176 M |
| 2,813,257 | 11/1957 | Cornell, Jr. | 339/65 R X |

FOREIGN PATENTS OR APPLICATIONS

| | | | |
|---|---|---|---|
| 1,473,224 | 2/1967 | France | 339/256 R |
| 614,012 | 12/1948 | Great Britain | 339/258 R |
| 1,040,322 | 5/1953 | France | 339/256 R |

*Primary Examiner*—Joseph H. McGlynn
*Assistant Examiner*—Terrell P. Lewis
*Attorney, Agent, or Firm*—William H. Kamstra

[57] ABSTRACT

A printed wiring board terminal assembly in which an adapter sleeve is inserted between the plated surface of a terminal hole and a terminal pin. The adapter sleeve is fashioned to present a plurality of longitudinal contacting nodes which expand radially to make electrical contact with the plating as the pin is inserted. The normal potentially damaging longitudinal stresses induced during pin insertion are thus converted to radial forces to preclude strain at the plating-wiring interfaces.

5 Claims, 2 Drawing Figures

PRINTED WIRING BOARD TERMINAL ASSEMBLY

BACKGROUND OF THE INVENTION

This invention relates to printed circuit board constructions and more particularly to terminal assemblies for making electrical connections to and between conductors carried by such boards.

Electrical circuit boards having in one or another manner wiring printed thereon have long been known in the art and have contributed substantially to reducing the cost of fabricating and maintaining complex electrical systems as well as to reducing the physical size of such systems. A printed circuit board is readily adapted to large-quantity production and is ideally suited to automated assembly techniques. In the employment of such circuit boards, many interconnections must be made with the printed wiring and components or other circuits external to the board. Where the circuit board construction comprises laminations of a number of layers, interconnections must frequently be made between circuits carried on different board layers. One well-known manner of achieving these interconnections is by drilling a hole through the insulating board and through the printed conductor or conductors. The latter may then be electrically connected by "plating-through" the hole to form therein a copper sleeve or eyelet which couples circuits on individual board layers by making contact with the drilled conductors. Additionally, the sleeve so formed conveniently acts as a receptacle for terminals which may be inserted to complete external electrical connections.

Although the advantages of printed wiring circuitry are obvious, stringent requirements of reliability may present particular problems in their fabrication. One concern, for example, resides in the possible failure of the interface between a hole plating and the so-called land of the printed wiring. This junction is already subject to longitudinal stress as a result of the differential thermal expansion of the materials employed. A fracture at such a junction could be isolated only with much difficulty and normally requires the replacement of the entire circuit board. The problem of longitudinal stress is aggravated when a terminal pin is inserted in the plated hole. To ensure a positive electrical connection and a firm support for the pin, the insertion is normally a press fit which produces considerable strain at the aforementioned interface and a shear force to the junction. This strain is proportionately increased as the hole diameter is decreased in response to the simultaneous demands for increased board capacity and reduction in board dimensions. Of necessity the plated-through cross section is thinner and hence weaker.

SUMMARY OF THE INVENTION

The problem of longitudinal stress induced by circuit board terminal pin insertion generally considered in the foregoing is advantageously overcome in accordance with this invention by a terminal assembly which, during pin insertion, generates only radial forces on the hole plating. These radial forces have the effect of providing positive electrical contact with what may be a nonuniform plating surface and tend to maintain immobile the plating interface with the wiring land. In one illustrative embodiment of this invention the radial forces are generated by an adapter sleeve loosely fitted in the plated hole, the terminal pin then being press fitted into the sleeve. The sleeve is formed somewhat cylindrical to present four circular protuberances or nodes running parallel with the longitudinal axes of the sleeve and the hole and adapted to contact the inner surfface of the plating of the latter. This contact is advantageously achieved by the force of the square terminal pin as it is pressed into the sleeve, its sides operating upon the four sleeve indentations resulting from the formation of the sleeve contacting nodes. In one embodiment, the sleeve is split along opposite indentations to permit a more ready response to the radial forces exerted by the terminal pin during insertion. The two halves of the sleeve thus formed are conveniently supported at the top by a connecting bridge having a square aperture adapted to admit the square terminal pin and align its surfaces with those of the sleeve indentations.

It is thus a feature of this invention that although longitudinal forces are still exerted during the insertion of a terminal pin into a circuit board plated hole, these forces are not transmitted to the hole plating and its wiring interfaces, the novel adapter sleeve effectively converting the potentially damaging longitudinal forces into useful radial forces. As a result, the reliability of a circuit board incorporating the terminal assembly of this invention is substantially increased.

BRIEF DESCRIPTION OF THE DRAWING

The organization and operation of a terminal assembly according to this invention together with its features will be better understood from a consideration of the detailed description of one illustrative embodiment thereof which follows when taken in conjunction with the accompanying drawing in which.

DETAILED DESCRIPTION

Figure 1:
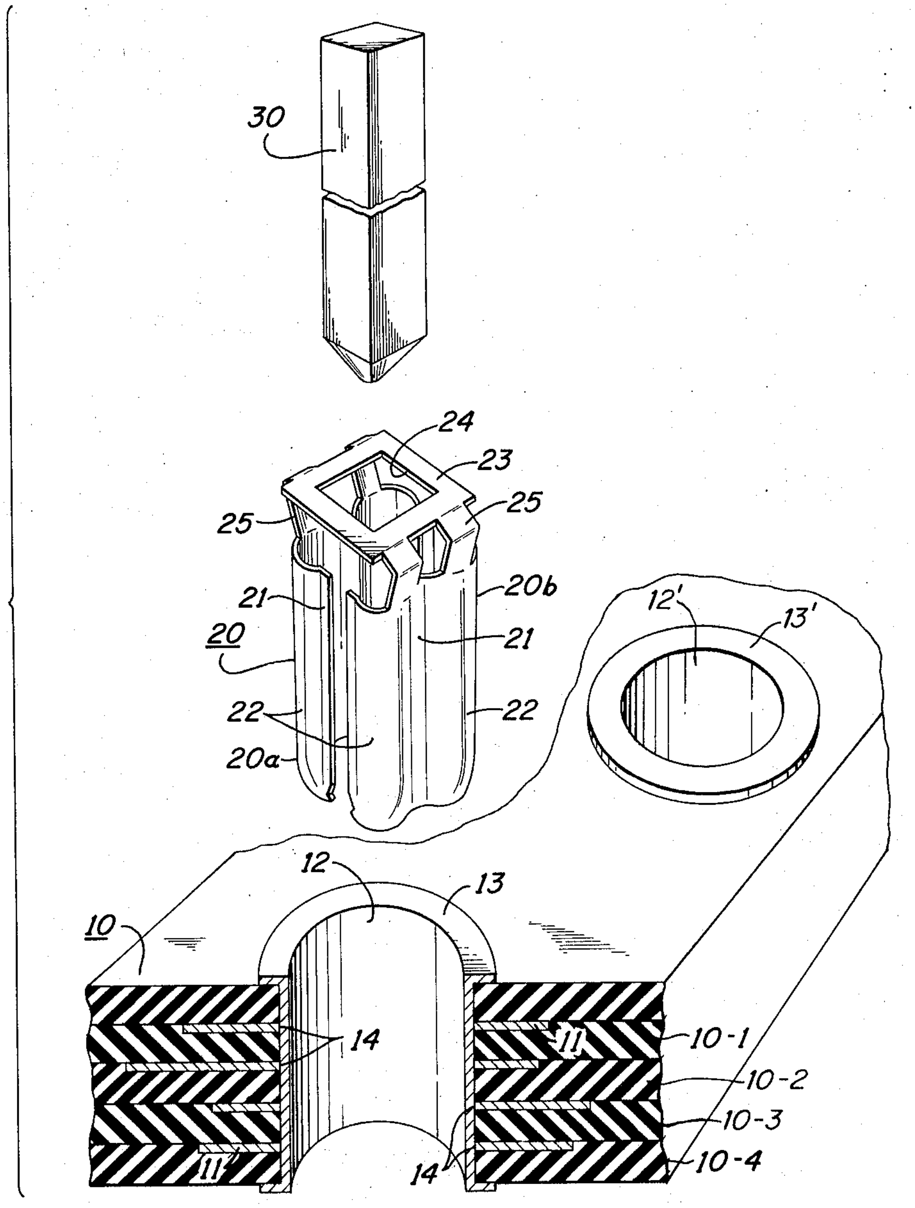
FIG. 1 depicts a single illustrative terminal assembly according to this invention shown in perspective, exploded view in connection with a portion of a multilayer printed wiring circuit board to demonstrate the relationship of the assembly elements.

A terminal pin assembly according to this invention is shown in exploded view in FIG. 1 as adapted to make electrical circuit connections with wiring printed on a plurality of layers of a multilayer circuit board 10. Only a portion of the board 10 is shown in cross section to disclose certain of its details as comprising four layers 10-1 through 10-4 each having electrical wiring printed thereon in various patterns not important to an understanding of this invention. Sections of the latter wiring are depicted as printed conductor strips 11. Although a typical circuit board would in practice have many connections made thereto, a single such connection will suffice for a complete description of this invention. This connection is made through a hole 12 drilled through the multilayer board 10 and through the printed conductors 11 on each layer between which conductors and an external point electrical connections are to be established. By the use of techniques well known in the art, a sleeve 13 of a conductive material such as copper is plated in the hole 12 to make electrical contact with the conductors 11 at interfaces 14. It is at these interfaces 14 of the plating 13 with the lands of the conductors 11 that a circuit board has in the past been vulnerable to the longitudinal stresses exerted by the press fit of a terminal pin.

Adapted to be free-fitted into plated sleeve 13 is an adapter sleeve 20. Although the sleeve 20 may be fashioned in any convenient manner such as by stamping from a flat blank, for example, for purposes of description only it may be thought of as initially having been cylindrical and then having longitudinal indentations 21 crimped therein at each quadrant to in turn form four arcuate nodes 22 running parallel with the longitudinal axis of the cylinder. Although a sleeve 20 formed as thus far described would serve to carry out the objects of this invention, in the specific embodiment being considered, the sleeve 20 is split at opposite quadrants to form two halves **20*a* and 20*b*. The latter halves are maintained in position at their tops as viewed in the drawing by a connecting bridge 23 formed integrally with the sleeve halves. The bridge 23 is provided with an aperture 24 of a form adapted to freely admit a terminal pin of the character to be described. The connecting bridge 23 and the halves 20*a* and 20*b* are further formed to present four legs 25, two for each half of the sleeve 20, to provide spring action as will appear hereinafter. At the end opposite to that of the bridge 23, the sleeve 20 has its nodes 22 slightly tapered and rounded to facilitate its free insertion in the hole 12 and its plated sleeve 13 of circuit board 10. A terminal pin 30 of a cross section adapted for fitting freely in the aperture 23 of sleeve 20 completes a catalogue of the elements of a terminal assembly of this invention. The pin 30 is conventionally employed to complete electrical circuits to components and circuit packs external to the printed wiring board. At the tapered ends, the nodes 22 may be crimped inwardly to serve as a stop for the pin 30. In the specific embodiment shown in FIG. 1, the pin 30 has a square cross section to accomplish its contacting function which is more clearly seen in the partial plan view of FIG. 2.**

Figure 2:
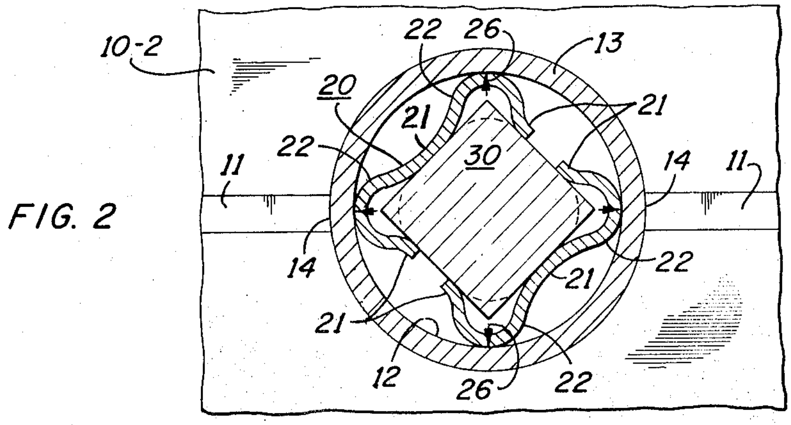
FIG. 2 is a partial plan and section view of the terminal assembly of FIG. 1 demonstrating the relationship of the elements and the forces generated thereby after their union.

The plan view of FIG. 2 is taken along a section of circuit board 10 of FIG. 1 which section, although not specifically there designated, may be determined as passing along the wiring side of any of the layers 10 such as the layer 10-2, for example. In FIG. 2, elements identical to those shown in FIG. 1 are designated by the same reference characters. Printed wiring conductors 11 are shown as being electrically connected at their land interfaces 14 with the plated sleeve 13 of hole 12. The adapter sleeve 20 of this invention is shown in place and making contact by means of its nodes 22 with the inner surface of plated sleeve 13. The latter is shown in cross section omitting its connecting bridge 23 and has inserted in place, terminal pin 30 also shown in cross section. During the press fitting of pin 30 into sleeve 20, it is evident that, because of the friction between the lateral surfaces of pin 30 and the inner surfaces of indentations 21, longitudinal stresses were exerted against the latter surfaces. In accordance with this invention, however, these stresses are adavantageously absorbed by the adapter sleeve 20 and are converted into radial forces exerted by the nodes 22 against the inner surface of plated sleeve 13. The radial forces are represented in FIG. 2 by arrows 26 and are effective in expanding the nodes 22 firmly into electrical contact with what may frequently be an uneven plating surface of sleeve 13. As is clear from FIG. 2, not only have longitudinal stresses at the interfaces 14 as the result of the press fit of pin 31 been completely eliminated, but the radial forces substituted tend to maintain the interfaces 14 in electrical contact should any fracture at those points have previously occurred.

The crimped configuration of sleeve 20 resulting in indentations 21 and contacting nodes 22 provides, if necessary, sufficient flexibility to permit its expansion under press fit by pin 30 without slitting the sleeve at opposite quadrants. In the illustrative embodiment depicted in the drawing, the separation of sleeve 20 into two halves provides additional flexibility as controlled by the spring action of legs 25. A crimping of the latter legs as shown permits as even expansion of the halves 20a and 20b of sleeve 20 parallel to its longitudinal axis. The arrangement and shape of aperture 24 of connecting bridge 23 ensures that pin 30, as it is inserted, will have its lateral surfaces precisely aligned with the inner surfaces of indentations 21.

It will be appreciated that the embodiment of this invention described in the foregoing is shown greatly enlarged in the drawing. In practice a terminal assembly according to this invention is adapted for fabrication in extremely small dimensions. Thus, in one construction, an adapter sleeve was dimensioned for a free fit in a plated hole having an inside diameter of 0.040 inch and for receiving a terminal pin measuring 0.025 inch on a side. Finally, it is to be understood that what has been described is considered to be only one specific illustrative embodiment of the invention and that various and numerous other arrangements may be devised by one skilled in the art without departing from the spirit and scope thereof as defined by the accompanying claims. For example, the terminal pin 30 may have other than a square cross section and could even be round to accomplish its radial force producing function. The adapter sleeve 20 could then be crimped to present more (or less) than the four indentations and nodes contemplated in the embodiment described.

What is claimed is:

1. A printed wiring board terminal assembly comprising a pin receptacle comprising a conductive plating in an aperture in said board, said plating being electrically connected with wiring on said board, a conductive adapter sleeve inserted within said plating, said sleeve being crimped to present a plurality of indentations and contacting nodes running substantially parallel with the longitudinal axis of said board aperture, and means for radially forcing said nodes into contact with said plating comprising a terminal pin inserted in said adapter sleeve having a surface presenting a plurality of faces for engaging and having electrical contact with, respectively, said plurality of indentations.

2. A printed wiring board terminal assembly as claimed in claim 1 in which said adapter sleeve also includes a bridge member connected across one end of said sleeve, said member having an aperture therein to conform to the cross section of said terminal pin and in which said adapter sleeve is split along opposite ones of said indentations to form two sleeve halves, said adapter sleeve also comprising spring means for connecting said bridge member to each of said sleeve halves for maintaining said halves substantially parallel with said longitudinal axis of said board aperture.

3. An adapter sleeve for maintaining a pin in position in a substantially cylindrical aperture, said sleeve being formed to present a plurality of indentations and contacting nodes running substantially parallel with the longitudinal axis of said aperture, said indentations being spaced so that said nodes are radially expanded into contact with the wall of said aperture upon the insertion of said pin between the inner surfaces of said indentations, said sleeve also having a bridge member connected across one end thereof, said member having an aperture therein conforming to the cross section of said pin, said sleeve being split along opposite ones of said indentations to form two sleeve halves, said sleeve also having spring means for connecting said bridge member to each of said sleeve halves for maintaining said halves substantially parallel with said wall of said aperture.

4. In combination, a circuit board means having electrical wiring carried thereon, a plurality of apertures in said board means and through said wiring, a conductive plating in each of said apertures in electrical connection with said wiring, and receptacle means for receiving a terminal pin in each of said apertures, each of said receptacle means comprising an adapter sleeve having a plurality of indentations therein to form a plurality of contacting nodes running parallel with the longitudinal axis of an aperture, said sleeve being split along opposite indentations to form separate portions, each sleeve also having a bridge member at one end thereof for maintaining said separate portions parallel to the wall of an aperture, said bridge member having an aperture therein to conform to the cross section of said terminal pin, and said indentations being spaced so that an inserted terminal pin exerts radial forces thereagainst for expanding said nodes into contact with said plating.

5. The combination as claimed in claim 4, said circuit board means comprising a plurality of layers each having individual patterns of said electrical wiring carried thereon, said conductive plating in each of said apertures being in electrical connection with the electrical wiring of particular ones of said patterns.

* * * * *